United States Patent
Choi et al.

(10) Patent No.: US 6,765,845 B2
(45) Date of Patent: Jul. 20, 2004

(54) HIERARCHICAL WORD LINE SCHEME WITH DECODED BLOCK SELECTING SIGNALS AND LAYOUT METHOD OF THE SAME

(75) Inventors: Hyun-Su Choi, Suwon (KR); Nak-Woo Sung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/676,797

(22) Filed: Oct. 1, 2003

(65) Prior Publication Data

US 2004/0095836 A1 May 20, 2004

(30) Foreign Application Priority Data

Nov. 18, 2002 (KR) ................................ 10-2002-0071707

(51) Int. Cl.⁷ ................................................. G11C 8/10
(52) U.S. Cl. ............. 365/230.06; 365/227; 365/230.03; 365/51; 365/63
(58) Field of Search ............................ 365/51, 63, 226, 365/227, 230.06, 230.03

(56) References Cited

U.S. PATENT DOCUMENTS

| | | | | |
|---|---|---|---|---|
| 5,517,456 A | * | 5/1996 | Chishiki | 365/230.03 |
| 5,959,906 A | * | 9/1999 | Song et al. | 365/200 |
| 6,404,693 B1 | * | 6/2002 | Choi et al. | 365/230.03 |
| 6,646,946 B2 | * | 11/2003 | Tomishima et al. | 365/230.03 |

* cited by examiner

Primary Examiner—Andrew Q. Tran
(74) Attorney, Agent, or Firm—Mills & Onello, LLP

(57) ABSTRACT

The device comprises km memory cell array blocks arranged in the form of a matrix, divided by x block selecting signals and y block selecting signals, and including a plurality of divided word lines arranged horizontally; a plurality of bit lines for each of the km memory cell array blocks arranged vertically; a plurality of main word lines for a plurality of bit lines for each of the km memory cell array blocks arranged horizontally; km of xy address word lines above or below the km memory cell array blocks; a decoder for decoding a corresponding x block selecting signal among x block selecting signals generated by decoding the x block selecting address and y block selecting signals generated by decoding the y block address to select corresponding m of xy address word lines and for being arranged for each of m memory cell array blocks arranged horizontally among the km memory cell array blocks; km of divided y address lines arranged vertically from the km of xy address word lines to the km memory cell array blocks; and word line driver for combining the plurality of the main word lines of each of the km memory cell array blocks and a signal of a corresponding xy address word line among the km of xy address word lines to select the plurality of the divided word lines.

7 Claims, 3 Drawing Sheets

# HIERARCHICAL WORD LINE SCHEME WITH DECODED BLOCK SELECTING SIGNALS AND LAYOUT METHOD OF THE SAME

This U.S. nonprovisional patent application claims priority under 35 U.S.C. §119 of Korean Patent Application 2002-71707 filed on Nov. 18, 2002, the entire contents of which are hereby incorporated by reference.

BACKGROUND OF THE INVENTION

1. Field of the Invention

The present invention relates to a semiconductor memory device, more particularly to a semiconductor memory device and a layout method of the same which can reduce power consumption.

2. Description of Related Art

In a conventional semiconductor memory device, word lines are horizontally arranged, and bit lines are vertically arranged, and memory cells are arranged between the word lines and the bit lines. A word line is selected by decoding a row address, and a bit line is selected by decoding a column address. The bit line arranged vertically is designed to perform a voltage swing within a range of 20% of a power supply voltage. So, power consumed in the bit line is "$y \times C \times 0.2(VDD)^2$", where C denotes a capacitance of the bit line, VDD denotes a power supply voltage, and y denotes the number of bit lines.

However, in the conventional semiconductor memory device, when one word line is selected, a charge sharing operation is performed between all memory cells connected to one word line and the bit lines, so that the number of bit lines is increased, causing an increase in power consumption.

In order to solve the problem described above, a semiconductor memory device having a divided word line structure has been introduced.

In the semiconductor memory device having the divided word line structure, a main word line and a divided word line are horizontally arranged, a bit line is vertically arranged, a memory cell is arranged between the divided word line and the bit line, and a y address word line for transmitting a block selecting signal for selecting a memory cell array block is vertically arranged. The divided word lines are divided in memory cell array block unit and selected by combining a signal for selecting the main word line and a block selecting signal for selecting a corresponding memory cell array block. So, a charge sharing operation is performed between the memory cells connected to the selected divided word line of the selected memory cell array block and the bit lines of the selected memory cell array block.

Therefore, the semiconductor memory device having the divided word line structure can reduce power consumption since only the bit lines of the selected memory cell array block perform an operation.

In general, the semiconductor memory device is designed such that the bit line arranged vertically performs a voltage swing within a range of 20% of the power supply voltage and the y address word line performs a full swing to the power supply voltage. Also, when C denotes a capacitance of the bit line, a capacitance of the y address word line is about four times as much as that of the bit line. So, when it is designed such that the memory cell array block divided into m and z memory cell arrays simultaneously selected, power consumption of the bit line is "$j/m \times C \times 0.2(VDD)^2$" and power consumption of the y address word line is "$z \times 4C \times (VDD)^2$", where when C denotes a capacitance of the bit line, VDD denotes a power voltage, and j denotes the number of bit lines.

As a result, even though power consumption of the bit line is reduced, the semiconductor memory device having the divided word line structure has a problem in that it has higher power consumption than the general semiconductor memory devices when the number of the y address word lines is increased.

SUMMARY OF THE INVENTION

It is an object of the present invention to provide a semiconductor memory device having a divided word line structure which can reduce power consumption in a y address word line.

It is another object of the present invention to provide a layout method of a semiconductor memory device having a divided word line structure which can reduce power consumption in a y address word line.

In order to achieve the above object, the present invention provides a semiconductor memory device. In the memory device, a quantity km of memory cell array blocks are arranged in the form of k×m matrix. The memory cell array blocks are divided by a quantity x of block selecting signals and a quantity y of block selecting signals. A plurality of divided word lines are arranged horizontally. Quantity km of xy address word lines are disposed above (or below) the km memory cell array blocks. Quantity km of divided y address word lines are arranged vertically from the km xy address word lines to the km memory cell array blocks.

The present invention further provides a semiconductor memory device, comprising km memory cell array blocks arranged in the form of k×m matrix, which are divided by x block selecting signals and y block selecting signals, and which include a plurality of divided word lines arranged horizontally. A plurality of bit lines for each of the km memory cell array blocks are arranged vertically. A plurality of main word lines for a plurality of bit lines for each of the km memory cell array blocks are arranged horizontally. Quantity km of xy address word lines are disposed above or below the km memory cell array blocks. A decoding means decodes a corresponding x block selecting signal among x block selecting signals generated by decoding the x block address and y block selecting signals generated by decoding the y block address to select corresponding m xy address word lines, the decoding means being arranged for each of m memory cell array blocks arranged horizontally among the km memory cell array blocks. Quantity km of divided y address lines are arranged vertically from the km xy address word lines to the km memory cell array blocks. A word line driving means combines the plurality of the main word lines of each of the km memory cell array blocks and a signal of a corresponding xy address word line among the km xy address word lines to select the plurality of the divided word lines, the word line driving means being arranged for each of the km memory cell array block.

In one embodiment, the y block selecting signals are vertically arranged collectively on a right (or a left) side.

The present invention further provides a layout method of a semiconductor memory device. In accordance with the method, km memory cell array blocks divided by x block selecting signals and y block selecting signals are arranged in the form of a matrix. A plurality of divided word lines of each of the km memory cell array blocks are arranged horizontally. Quantity km xy address word lines are arranged above (or below) the km memory cell array blocks. Quantity km divided y address word lines are arranged vertically connected from each of the km xy address word lines on a left (or a right) side of each of the km memory cell array blocks.

The present invention further provides a layout method of a semiconductor memory device. In accordance with the method, km memory cell array blocks divided by x block selecting signals and y block selecting signals are arranged in the form of k×m matrix. A plurality of main word lines of the km memory cell array blocks are arranged horizontally; a plurality of bit lines are arranged vertically; and a plurality of divided word lines of each of the km memory cell array blocks are arranged horizontally. A quantity m of xy address word lines of m memory cell array blocks vertically arranged among the km memory cell array blocks are arranged horizontally above(or below) m memory cell array blocks arranged horizontally. A quantity y of address word lines of each of the km memory cell array blocks connected to xy address word lines of each of the km memory cell array blocks are arranged vertically on a left(or a right) side of each of the km memory cell array blocks.

In one embodiment, the y clock selecting signals are vertically arranged collectively on a right (or a left) side of the km memory cell array blocks.

In one embodiment, the method further comprises arranging, on a right (or a left) side of the corresponding xy address word lines, a decoding means for decoding a corresponding x block selecting signal among x block selecting signals generated by decoding the x block address and y block selecting signals generated by decoding the y block address to select the corresponding xy address word lines arranged horizontally above (or below) each of the km memory cell array blocks.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts.

DETAILED DESCRIPTION OF PREFFERED EMBODIMENTS

Reference will now be made in detail to preferred embodiments of the present invention, examples of which are illustrated in the accompanying drawings.

Figure 1:
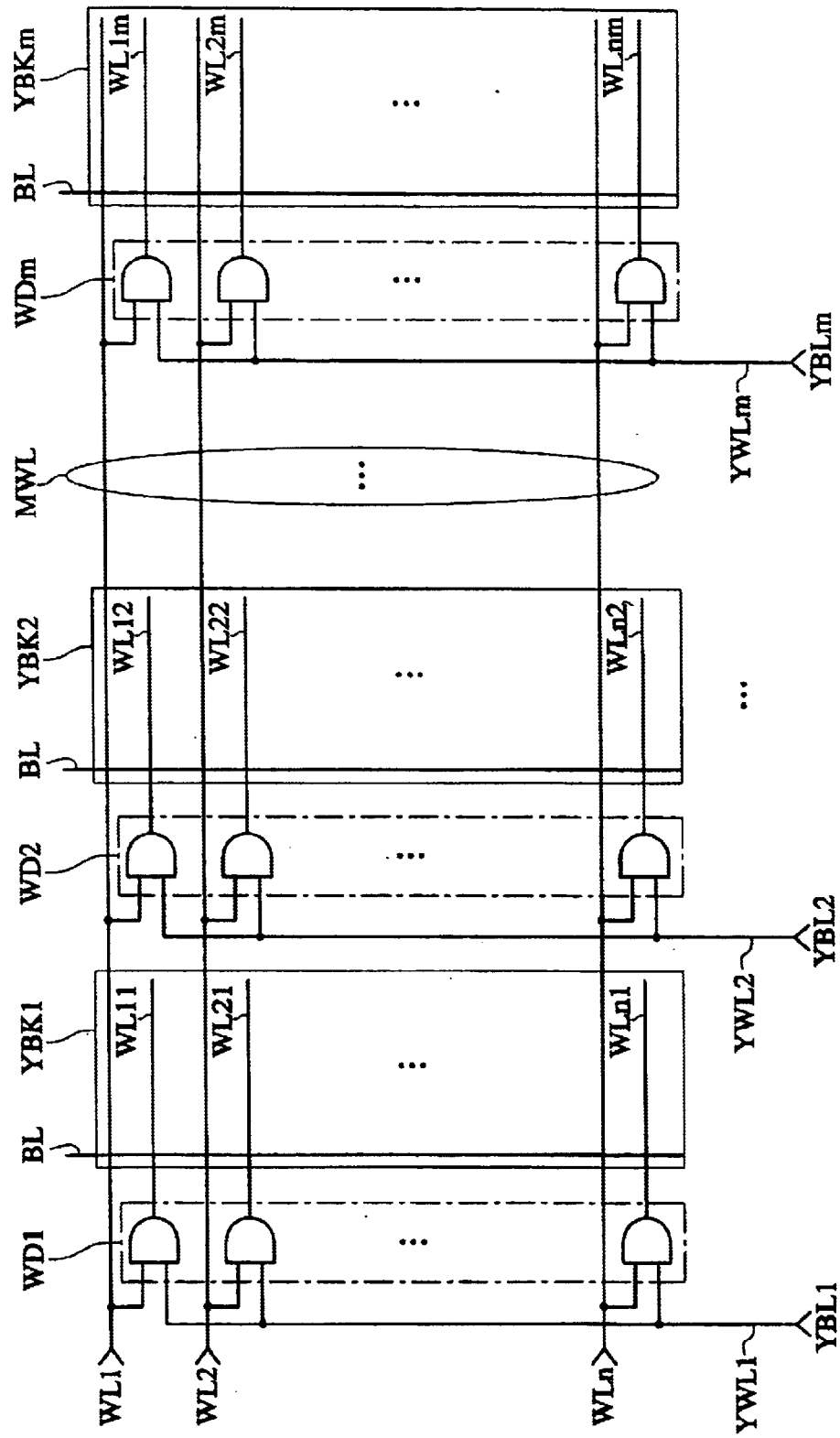
FIG. 1 is a block diagram illustrating a conventional semiconductor memory device having a divided word line structure.

FIG. 1 is schematic block diagram of a conventional semiconductor memory device having a divided word line structure. The semiconductor memory device of FIG. 1 includes m memory cell array blocks YBK1 to YBKm and m word line drivers WD1 to WDm.

In FIG. 1, main word lines MWL are horizontally arranged. Divided word lines WL11 to WL1m, . . . , WLn1 to WLnm respectively separated from the main word lines are horizontally arranged. Bit lines are vertically arranged, and y address word lines YWL1 to YWLm are vertically arranged.

Though not shown, a row decoder decodes a row address to generate main word line selecting signals WL1 to WLn for selecting the main word line MWL, and a block address decoder decodes a block address to generate block selecting signals YBL1 to YBLm.

A word line driver WD1 includes AND gates which AND the main word line selecting signals WL1 to WLn and the block selecting signal YBL1 to select divided word lines WL11 to WLn1, respectively. Similarly, each of the word line drivers WD2 to WDm includes AND gates which AND the main word line selecting signals WL1 to WLn and the block selecting signals YBL2 to YBLm to select the divided word lines WL12 to WLn2, . . . , WL1m to WLnm, respectively.

Operation of the semiconductor memory device of FIG. 1 is described below.

When the row address and the block address are applied, the row decoder decodes the row address to generate the word line signals WL1 to WLn, and the block address decoder decodes the block address to generate the block selecting signals YBL1 to YBLm.

Here, in the case of the word line selecting signal WL1 having a "high" level is generated when the row decoder decodes the row address and the block selecting signal YBL1 is generated when the block address decoder decodes the block address, the AND gate of the word line driver WD1 selects the divided word line WL11.

As a result, the memory cells connected to the divided word line WL11 are selected, and a charge sharing operation is performed between the bit line BL of the memory cell array block YBK1 and the memory cells connected to the divided word line WL11.

Here, since other divided word lines except the divided word line WL11 are not selected, the bit lines of other memory cell array blocks YBK2 to YBKm except the memory cell array block YBK1 do not operate.

Therefore, the conventional semiconductor memory device having the divided word line structure has an advantage in that power consumed in the bit lines can be reduced to 1/m compared to the conventional semiconductor memory device.

However, since the y address word lines as well as the bit lines are arranged vertically, power consumed in the y address word lines cannot be ignored. Also, the y address word line performs a full swing to a power voltage, and therefore it has higher power consumption than the bit line.

When the semiconductor memory device is designed such that the memory cell block is divided into m and z memory cell array blocks selected at the same time, power consumed in the bit line and the y address word line are "j/m×C×0.2(VDD)$^2$" and "z×4C×(VDD)$^2$", respectively, where C denotes a capacitance of the bit line, VDD denotes a power voltage, and j denotes the number of the bit lines. As can be seen in the formulas, power consumption of one y address word line is 20 times as much as that of one bit line. This means that power consumed by the 20 bit lines is equal to power consumed by the one y address word line.

Accordingly, as the number of memory cell array blocks which are simultaneously selected by one block selecting signal is increased, the number of the y address word line is increased. This causes power consumption of the y address word line to increase.

The semiconductor memory device of FIG. 1 can reduce power consumption of the bit line, but when the number of the y address word lines which operate at the same time as the bit line is increased, power consumption of the y address word line is increased, thereby increasing power consumption of the whole semiconductor memory device.

Figure 2:
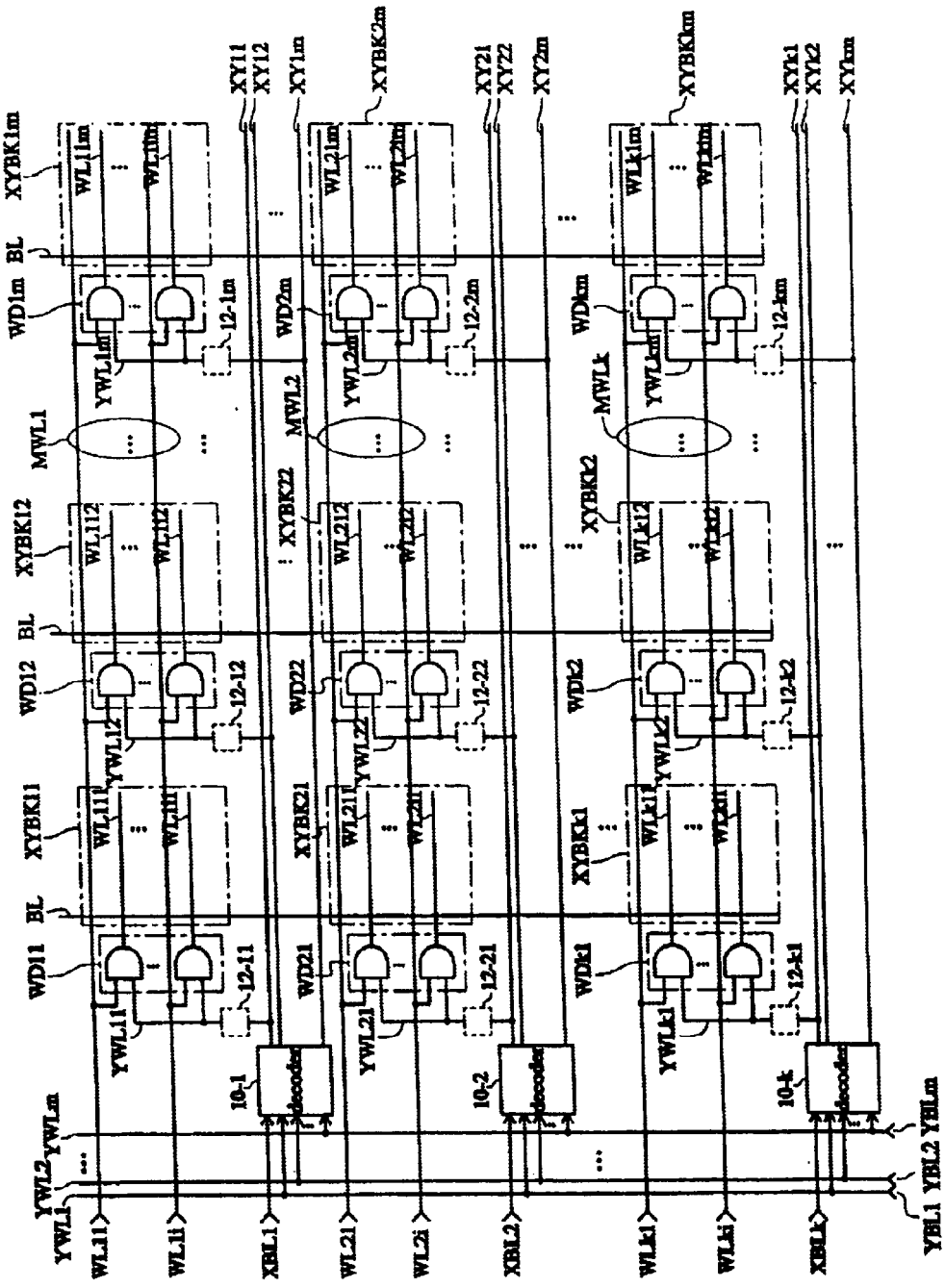
FIG. 2 is a block diagram illustrating a semiconductor memory device having a divided word line structure according to an embodiment of the present invention.

FIG. 2 is a block diagram illustrating a semiconductor memory device having a divided word line structure according to an embodiment of the present invention. The semiconductor memory device of FIG. 2 includes km memory cell array blocks XYBK11 to XYBKkm, km word line drivers WD11 to WDkm, k decoders 10-1 to 10-k, and km drivers 12-11 to 12-km.

Like the circuit of FIG. 1, main word lines MWL1 to MWLk are horizontally arranged. Divided word lines WL111 to WL1il, . . . , WLk1m to WLkim respectively separated from the main word lines MWL1 to MWLk are horizontally arranged. The bit lines are vertically arranged. y address word lines YWL1 to YWLm are vertically arranged on one side. Divided y address word lines YWL11 to YWLkm are vertically arranged. xy address word lines XY11 to XY1m, . . . , XYk1 to XYkm are horizontally arranged between memory cell array blocks which are arranged up and down.

Like the circuit of FIG. 1, main word line selecting signals WL1 to WLn for selecting the main word lines MWL1 to MWLk are generated when a row decoder decodes a row address, and y block selecting signals YBL1 to YBLm for selecting the memory cell array blocks in y direction are generated when a y block address decoder decodes a y block address. x block selecting signals XBL1 to XBLk for selecting the memory cell array blocks in x direction are generated when an x block address decoder decodes an x block address.

The decoder 10-1 decodes the x block selecting signal XBL1 and the y block selecting signals YBL1 to YBLm to select the xy address word lines XY11 to XY1m, respectively. That is, the decoder 10-1 outputs the y block selecting signals YBL1 to YBLm in response to the x block selecting signals XBL1 to select the xy address word lines XY11 to XY1m. The other decoders 10-2 to 10-k decode the x block selecting signals XBL2 to XBLk and the y block selecting signals YBL1 to YBLm to select the xy address word lines XY21 to XY2m, . . . , XYkl to XYkm, respectively.

The word line driver WD11 includes AND gates which AND the main word line selecting signals WL11 to WL1i and a signal of the xy address word line XY11 to select the divided word lines WL111 to WL1il, respectively. Similarly, each of the word line drivers WD12 to WD1m includes AND gates which AND the main word line selecting signals WL11 to WL1i and a signal of the xy address word lines XY12 to XY1m to select the divided word lines WL112 to WL1i2, . . . , WL11m to WL1im, respectively. The other word line drivers WD21 to WDkm are configured in the same way as the word line drivers WD11 to WD1i.

The drivers drive signals of the xy address word lines XY11 to XYkm, respectively. The drivers 12-11 to 12-km of FIG. 2 are optionally provided. That is, the drivers 12-11 to 12-km can be omitted.

As described above, the semiconductor memory device of FIG. 2 is configured such that the memory cell arrays are divided in block unit by the xy block address as well as the y block address, the xy address word lines are arranged up and down the memory cell array blocks, the y address word lines are collectively arranged on one side, and the y address word lines respectively separated from the xy address word lines are vertically arranged.

In the semiconductor memory device having the y address word line structure divided in the above described method, capacitance of the divided y address word line is decreased, and so power consumption of the y address word line is reduced. That is, when the memory cell array is vertically divided into k, a capacitance of the divided y address word line is reduced to 1/k compared to that of the circuit of FIG. 1, whereby power consumption is reduced to 1/k. Power can be consumed in one y address word line, but the consumed power is not as much as that due to the capacitance of the y address word line of the conventional semiconductor memory device of FIG. 1, and, so it can be considered negligible. That is, capacitance of the y address word line of FIG. 1 is large since the gates of the same number as the divided word lines are connected to the y address word line, whereas capacitance of the y address word line is reduced since only the decoders are connected to the y address word line.

Operation of the semiconductor memory device of FIG. 2 is described below.

When the row address and the y block address are applied, the row decoder decodes the row address to generate the word line signals WL1 to WLn, and the y block address decoder decodes the y block address to generate the y block selecting signals YBL1 to YBLm. The x block address decoder decodes the x block address among the row addresses to generate the x block selecting signal XBL1 to XBLk.

Here, when the word line selecting signal WL11 having a "high" level is generated when the row decoder decodes the row address, and the y block selecting signal YBL1 is generated when the y block address decoder decodes the y block address, and the x block selecting signal XBL1 is generated when the x block address decoder decodes the x block address, the decoder 10-1 selects the xy address word line XY11. The driver 12-11 drives a signal of the xy address word line XY11 to select the divided y address word line YWL11. Then, the AND gate of the word line driver WD11 selects the divided word line WL111.

As a result, the memory cells connected to the divided word line WL111 are selected, and a charge sharing operation is performed between the bit line BL of the memory cell array block XYBK11 and the memory cells connected to the divided word line WL111.

At this time, since other divided word lines except the divided word line WL111 are not selected, the bit lines of other memory cell array blocks XYBK12 to XYBKm except the memory cell array block XYBK11 do not operate.

Therefore, in the semiconductor memory device having the divided word line structure according to the present invention, power consumption of the bit line is equal to that of FIG. 1, but power corisumption of the y address word line is reduced.

When the semiconductor memory device is designed such that the memory cell block divided into km and z memory cell array blocks are selected at the same time, power consumption of the bit line and the y address word line are "$j/m \times C \times 0.2(VDD)^2$" and "$z \times 4C/k \times (VDD)^2$", respectively, where C denotes capacitance of the bit line, VDD denotes a power voltage, and j denotes the number of the bit lines. As can be seen in the formulas, power consumption of one y address word line is reduced to 1/k compared to that of FIG. 1.

Figure 3:
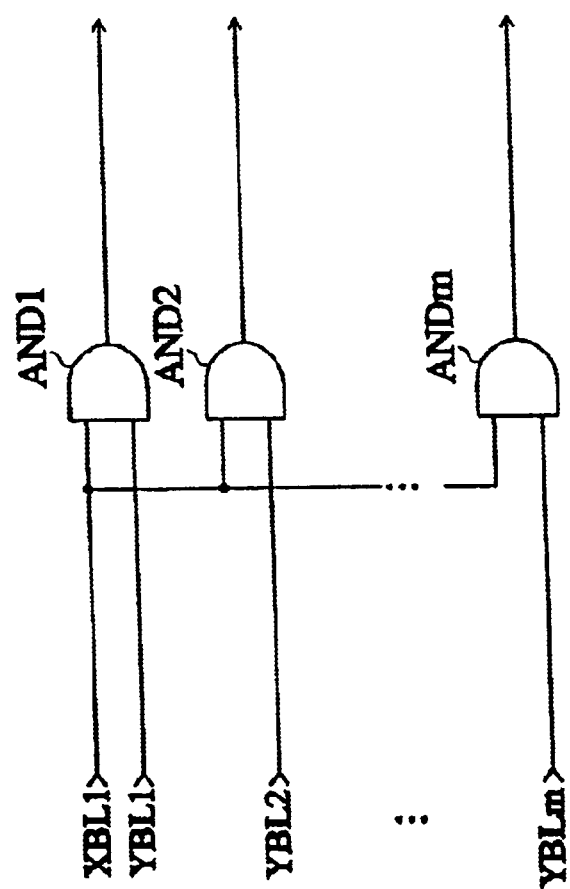
FIG. 3 is a block diagram illustrating a decoder according to an exemplary embodiment of the semiconductor memory device of FIG. 2.

FIG. 3 is a block diagram illustrating the decoder 10-1. The decoder of FIG. 3 includes m AND gates AND1 to ANDm.

Operation of the decoder of FIG. 3 is described below.

The AND gate AND1 ANDs the x block selecting signal XBL1 and the y block selecting signal YBL1 to generate a signal for selecting the xy address word line XY11. The AND gates AND2 to ANDm AND the x block selecting signal XBL1 and the y block selecting signals YBL12 to YBLm to generate signals for selecting the xy address word lines XY12 to XY1m, respecitvely.

The other decoders 10-2 to 10-k have the same configuration as that of FIG. 3.

An embodiment of the present invention shows the decoders include the AND gates. In this case, the drivers 12-11 to 12-km can be configured by logic gates such as buffers.

However, when the decoders include NAND gates, the drivers 12-11 to 12-km can be configured by logic gates such as inverters.

That is, the decoders and the drivers can be configured in various forms.

As described herein, the semiconductor memory device having the divided word line structure according to the present invention can reduce power consumption of the y address word line by dividing the y address word line.

While the invention has been particularly shown and described with reference to preferred embodiments thereof, it will be understood by those skilled in the art that the foregoing and other changes in form and details may be made therin without departing from the spirit and scope of the invention.

What is claimed is:

1. A semiconductor memory device, comprising:
   km memory cell array blocks arranged in the form of a kxm matrix, divided by x block selecting signals and y block selecting signals, and including a plurality of divided word lines arranged horizontally;
   km of xy address word lines arranged above or below the km memory cell array blocks; and
   km of divided y address word lines arranged vertically from the km of xy address word lines to the km memory cell array blocks.

2. A semiconductor memory device, comprising:
   km memory cell array blocks arranged in the form of a kxm matrix, divided by x block selecting signals and y block selecting signals, and including a plurality of divided word lines arranged horizontally;
   a plurality of bit lines for each of the km memory cell array blocks arranged vertically;
   a plurality of main word lines for the plurality of bit lines for each of the km memory cell array blocks arranged horizontally;
   km of xy address word lines above or below the km memory cell array blocks;
   decoding means for decoding a corresponding x block selecting signal among x block selecting signals generated by decoding the x block selecting address and y block selecting signals generated by decoding the y block address to select corresponding m of xy address word lines and for being arranged for each of m memory cell array blocks arranged horizontally among the km memory cell array blocks;
   km of divided y address word lines arranged vertically from the km xy address word lines to the km memory cell array blocks; and
   word line driving means for combining the plurality of the main word lines of each of the km memory cell array blocks and a signal of a corresponding xy address word line among the km of xy address word lines to select the plurality of the divided word lines and for being arranged horizontally for each of the km memory cell array blocks.

3. The device of claim 2, wherein the y block selecting signals are vertically arranged collectively on a right or a left side.

4. A layout method of a semiconductor memory device, comprising:
   arranging km memory cell array blocks divided by x block selecting signals and y block selecting signals in the form of a matrix and arranging horizontally a plurality of divided word lines of each of the km memory cell array blocks;
   arranging km of xy address word lines above or below the km memory cell array blocks; and
   arranging km of divided y address word lines vertically connected from each of the km of xy address word lines on a left or a right side of each of the km memory cell array blocks.

5. A layout method of a semiconductor memory device, comprising:
   arranging km memory cell array blocks divided by x block selecting signals and y block selecting signals in the form of a kxm matrix, arranging horizontally a plurality of main word lines of the km memory cell array blocks, arranging vertically a plurality of bit lines, and arranging horizontally a plurality of divided word lines of each of the km memory cell array blocks;
   arranging horizontally m of xy address word lines of m memory cell array blocks horizontally arranged among the km memory cell array blocks above or below m memory cell array blocks arranged horizontally; and
   arranging vertically y address word lines of each of the km memory cell array blocks connected to xy address word lines of each of the km memory cell array blocks on a left or a right side of each of the km memory cell array blocks.

6. The layout method of claim 5, wherein the y block selecting signals are vertically arranged collectively on a right or a left side of the km memory cell array blocks.

7. The layout method of claim 5, further comprising, arranging, on a right or a left side of the corresponding xy address word lines, a decoding means for decoding a corresponding x block selecting signal among x block selecting signals generated by decoding the x block address and y block selecting signals generated by decoding the y block address to select the corresponding xy address word lines arranged horizontally above or below each of the km memory cell array blocks.

* * * * *